United States Patent
Tu et al.

(10) Patent No.: US 9,548,420 B2
(45) Date of Patent: Jan. 17, 2017

(54) LIGHT-EMITTING DEVICE AND MANUFACTURING METHOD THEREOF

(71) Applicant: EPISTAR CORPORATION, Hsinchu (TW)

(72) Inventors: Chun-Hsiang Tu, Hsinchu (TW); De-Shan Kuo, Hsinchu (TW); Po-Shun Chiu, Hsinchu (TW); Chi-Shiang Hsu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 14/691,221

(22) Filed: Apr. 20, 2015

(65) Prior Publication Data
US 2016/0308095 A1    Oct. 20, 2016

(51) Int. Cl.
| | | |
|---|---|---|
| H01L 27/15 | (2006.01) | |
| H01L 29/06 | (2006.01) | |
| H01L 29/10 | (2006.01) | |
| H01L 27/14 | (2006.01) | |
| H01L 33/22 | (2010.01) | |
| H01L 33/00 | (2010.01) | |

(52) U.S. Cl.
CPC ............. *H01L 33/22* (2013.01); *H01L 33/005* (2013.01)

(58) Field of Classification Search
CPC ............................... H01L 33/22; H01L 33/005
USPC .......... 257/79, 98, 13, 101, E33.068, 43, 72; 438/27, 29, 37, 42, 758, 404
See application file for complete search history.

(56) References Cited

U.S. PATENT DOCUMENTS

| | | | | |
|---|---|---|---|---|
| 2003/0010971 A1* | 1/2003 | Zhang | .................... | B82Y 10/00 257/15 |
| 2010/0035068 A1* | 2/2010 | Lammel | ............ | H01L 21/02008 428/428 |
| 2012/0049151 A1* | 3/2012 | Zhang | .................... | H01L 33/007 257/13 |
| 2012/0138980 A1* | 6/2012 | Kuo | ................ | H01L 31/035227 257/94 |
| 2012/0187423 A1* | 7/2012 | Tsai | ....................... | H01L 33/501 257/79 |
| 2014/0048831 A1* | 2/2014 | Fujino | .................... | H01L 33/50 257/98 |
| 2014/0209859 A1* | 7/2014 | Cha | ........................ | H01L 33/005 257/13 |

* cited by examiner

*Primary Examiner* — Dzung Tran
(74) *Attorney, Agent, or Firm* — Muncy, Geissler, Olds & Lowe, P.C.

(57) ABSTRACT

A light-emitting device comprises a substrate comprising a top surface; a light-emitting stack formed on a portion of the top surface of the substrate; and a plurality of pores formed in an area of the substrate, wherein the area is under another portion of the top surface where the light-emitting stack is not formed thereon.

14 Claims, 7 Drawing Sheets

LIGHT-EMITTING DEVICE AND MANUFACTURING METHOD THEREOF

TECHNICAL FIELD

The disclosure relates to a light-emitting device, and more particularly, to a light-emitting device comprising a light-emitting stack and a textured substrate comprising microstructures, and the manufacturing method thereof.

DESCRIPTION OF BACKGROUND ART

Light-emitting diode (LED) is widely used as a solid-state light source. Light-emitting diode (LED) generally comprises a p-type semiconductor layer, an n-type semiconductor layer, and an active layer between the p-type semiconductor layer and the n-type semiconductor layer for emitting light. The principle of the LED is to transform electrical energy to optical energy by applying electrical current to the LED and injecting electrons and holes to the active layer. The combination of electrons and holes in the active layer emits light accordingly.

SUMMARY OF THE DISCLOSURE

A light-emitting device comprises a substrate comprising a top surface; a light-emitting stack formed on a portion of the top surface of the substrate; and a plurality of pores formed in an area of the substrate, wherein the area is under another portion of the top surface where the light-emitting stack is not formed thereon.

DETAILED DESCRIPTION OF THE PRESENT DISCLOSURE

Figure 1:
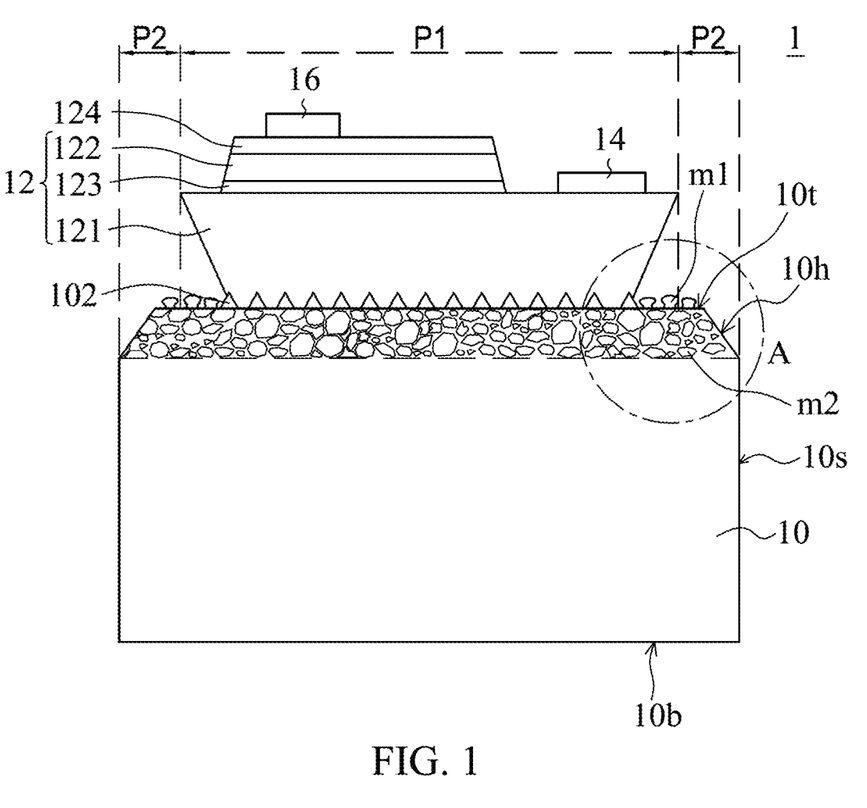
FIG. 1 shows a side view of a light-emitting device in accordance with an embodiment of the present disclosure.
Figure 2:
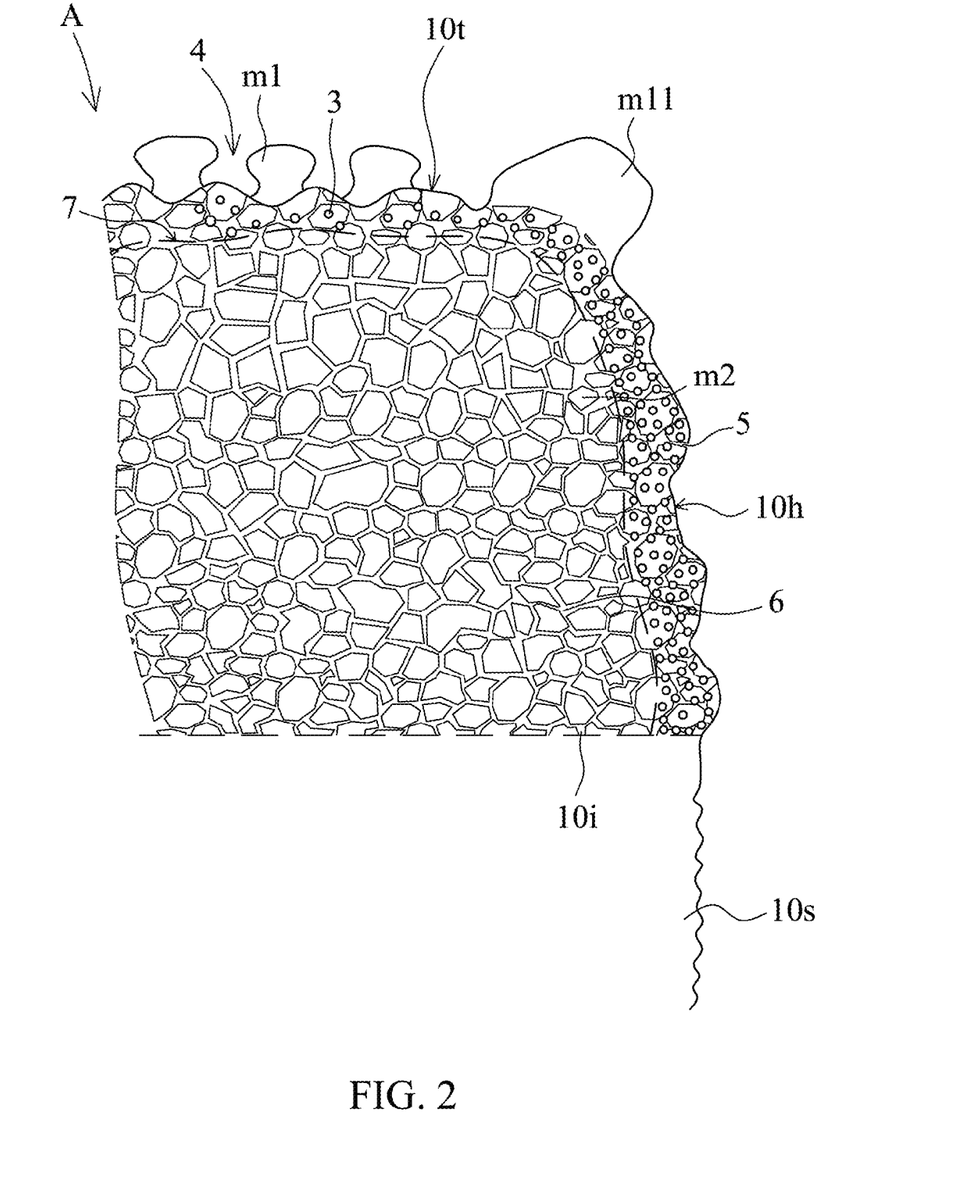
FIG. 2 shows a side view of a magnified view of region A of the light-emitting device of FIG. 1.

FIG. 1 shows a side view of a light-emitting device 1 in accordance with an embodiment of the present disclosure. FIG. 2 shows a side view of a magnified view of region A of the light-emitting device 1 of FIG. 1. The light-emitting device 1 comprises a light-emitting stack 12 epitaxially grown on a substrate 10 by epitaxy method, such as metallic-organic chemical vapor deposition (MOCVD) method, molecular beam epitaxy (MBE) method, or hydride vapor phase epitaxy (HVPE) method. The light-emitting stack 12 comprises a first semiconductor layer 121 having a first conductivity type, a second semiconductor layer 122 having a second conductivity type different from the first conductivity type, and an active layer 123 formed between the first semiconductor layer 121 and the second semiconductor layer 122. The active layer 123 comprises a single heterostructure (SH), a double heterostructure (DH), or a multi-quantum well (MQW) structure. In one embodiment, the first semiconductor layer 121 is an n-type semiconductor layer for providing electrons, the second semiconductor layer 122 is a p-type semiconductor layer for providing holes, and holes and electrons combine in the active layer 123 to emit light under a driving current. The material of the active layer 123 comprises $In_xGa_yAl_{1-x-y}N$ for emitting light having a dominant wavelength in the ultraviolet to green spectral regions, $In_xGa_yAl_{1-x-y}P$ for emitting light having a dominant wavelength in the yellow to red spectral regions, or $In_xGa_yAl_{1-x-y}As$ for emitting light having a dominant wavelength in the infrared spectral region. In one embodiment, the light-emitting stack 12 comprises an inverted pyramidal shape.

A transparent conductive layer 124 comprising conductive material is formed on the second semiconductor layer 122. The transparent conductive layer 124 covers a substantially entire surface of the second semiconductor layer 122, and is transparent to the wavelength of the light emitted from the active layer 123. The transparent conductive layer 124 can be formed of a thin metal film or a metal oxide film, such as zinc oxide, indium oxide, tin oxide, indium tin oxide (ITO), or indium zinc oxide (IZO).

A first electrode 14 and a second electrode 16 are respectively formed on the first semiconductor layer 121 and the second semiconductor layer 122. The first electrode 14 and the second electrode 16 comprise metal material having low electrical resistance, such as Au, Al, Pt, Cr, Ti, Ni, W, or the combination thereof, and can be formed of a monolayer film or a multilayer film. A thickness of the first electrode 14 or the second electrode 16 is about 0.1 to 10 microns. The first electrode 14 and the second electrode 16 can have any shape such as rectangular, polygon, circle, and ellipse from a top view of the light-emitting device 1.

The first electrode 14, the second electrode 16, and the transparent conductive layer 124 can be formed by sputtering, vapor deposition, or plating.

The substrate 10 comprises a single crystal material on which the light-emitting stack 12 can be epitaxial grown. An insulating material such as sapphire comprising C-plane, R-plane, or A-plane can be used to be the substrate 10. In another example, silicon carbide (SiC), silicon, ZnO, GaAs, GaN can be used. Further, the light-emitting device 1 can be flipped to mount to a sub-mount (not shown), and majority of the light is extracted from a bottom surface 10b of the substrate 10. Therefore, since light emitted from the active layer 123 mainly emits through the bottom surface 10b of the substrate 10, the substrate 10 is preferably transparent to the dominant wavelength of the light.

The substrate 10 comprises a top surface 10t having a first portion p1 and a second portion p2 surrounding the first portion p1 viewing from a top of the light-emitting device 1, a side surface 10s approximately perpendicular to the top surface 10t, and an inclined surface 10h formed between the top surface 10t and the side surface 10s, wherein an angle between the top surface 10t and the inclined surface 10h or an angle between the inclined surface 10h and the side surface 10s is larger than 90 degrees, or preferably between 90 and 130 degree, or more preferably between 95 and 110 degree.

The top surface 10t is approximately parallel to a plane of the active layer 123, and the top surface 10t comprises a plurality of concavo-convex structures regularly pattern distributed on the substrate 10. More specifically, the plurality of concavo-convex structures is periodically distributed on the substrate 10. In one example of the embodiment, the concavo-convex structures 102 within the first portion p1 of the top surface 10t have an uniform shape, a cone shape for example, and the concavo-convex structures within the second portion p2 of the top surface 10t have dissimilar shapes to each other. The plurality of concavo-convex structures and the substrate 10 are of one-piece and substantially composed of the same material.

FIG. 2 shows a magnified side view of region A of the light-emitting device 1 of FIG. 1. As shown in FIG. 2, the plurality of concavo-convex structures formed on the second portion p2 of the top surface 10t comprises a plurality of first micro-structures m1. More specifically, the plurality of first micro-structures m1 comprises a plurality of first micro-protrusions protruded from the substrate 10. Feature sizes of the plurality of first micro-structures m1 are dissimilar. In an example of the embodiment, the plurality of first micro-structures m1 comprises a height ranging from 0.1 μm to 5 μm from a cross sectional view of the light-emitting device 1. The first micro-structures m1 closest to the inclined surface 10h has a greater height than other first micro-structures m1 distant from the inclined surface 10h. In an example of the embodiment, a height of the first micro-structures m11 closest to the inclined surface 10h is 1.5 to 2.5 times a height of others of the plurality of first micro-structures m1 distant from the inclined surface 10h. Parts of the plurality of first micro-structures m1 have a mushroom shape with the caps connected each other, thus a space 4 is defined between the plurality of first micro-structures m1. In an example of the embodiment, the space 4 comprises a width between 0.1 μm and 1 μm.

An upper part of the substrate 10 comprises a plurality of second micro-structures m2, and a lower part of the substrate 10 is free of such micro-structures like the first micro-structure m1 and the second micro-structure m2, wherein the upper part of the substrate 10 is defined by a region surrounded by the inclined surface 10h, and the lower part of the substrate 10 is defined by a region surrounded by the side surface 10s.

The substrate 10 comprises a plurality of second micro-structures m2 distributing from the top surface 10t to an interior 10i of the substrate 10. A distance between the top surface 10t and the interior 10i is not smaller than 10% of a thickness of the substrate 10 or not smaller than 8 microns. Preferably, the distance between the top surface 10t and the interior 10i is larger than 10 μm when the thickness of the substrate 10 is larger than 80 μm. The plurality of second micro-structures m2 comprises irregular shape, thus a micro-space 6 is formed between adjacent two of the plurality of second micro-structures m2. The plurality of second micro-structures m2 comprises a feature size larger than that of the plurality of first micro-structures m1. The "feature size" means a maximum length between any two points of a structure. In an example of the embodiment, the plurality of second micro-structures m2 comprises a height ranging from 1 μm to 5 μm, and/or a width ranging from 3 μm to 10 μm from a cross sectional view of the light-emitting device 1

As shown in FIG. 2, the substrate 10 comprises a plurality of pores 3 formed on the plurality of second micro-structures m2. The plurality of pores 3 comprises a feature size smaller than a feature size of a space 4 defined by adjacent two first micro-structures m1 or smaller than a feature size of the a micro-space 6 defined by adjacent two second micro-structures m2. In an example of the embodiment that the substrate 10 is a sapphire substrate, the plurality of pores 3 is confined by sides with crystal planes such as R-plane of the sapphire substrate. Each of the plurality of pores 3 comprises a feature size ranging from 0.02 mm to 0.2 mm. The plurality of pores 3 comprises hexagonal shape. A side surface of the plurality of pores 3 comprises an inclined surface. The plurality of pores 3 comprises vacancy.

As show in FIG. 2, a roughness of the inclined surface 10h is larger than that of the side surface 10s. The inclined surface 10h comprises a plurality of recesses 5 which is connected with the micro-space 6 formed between the plurality of second micro-structures m2.

The substrate 10 comprises a doped region 7 formed within the second portion p2 of the substrate 10, wherein the plurality of pores 3 is formed in the doped region 7. In another words, the plurality of pores 3 is formed on the plurality of second micro-structures m2. In another embodiment, the doped region 7 is formed along an outer periphery of the first portion p1 of the substrate 10 viewing from a top of the light-emitting device 1. The doped region 7 is other than n-type and p-type. The doped region 7 comprises a dopant other than any dopants in the light-emitting stack. In an example of the embodiment, the dopant for forming the doped region 7 comprises argon cation, hydrogen cation, or nitrogen cation.

Figure 3:
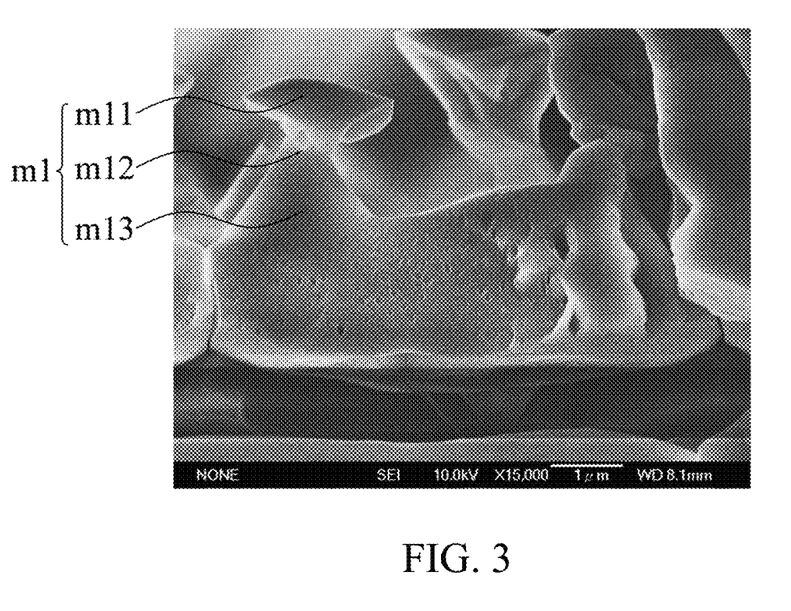
FIG. 3 shows a SEM diagram of a portion of a substrate surface of the light-emitting device in accordance with an embodiment of the present disclosure.

FIG. 3 shows an SEM diagram of the light-emitting device 1 of FIG. 1. One of the plurality of first micro-structures m1 comprises an upper part m11, middle part 12, and a lower part m13, wherein the middle part m12 is formed between the upper part m11 and the lower part m13, and the middle part m12 comprises a width smaller than that of the upper part m11 and that of the bottom part m13. The lower part m13 comprises a pyramidal shape from a cross sectional view of the light-emitting device 1.

Figure 4A:
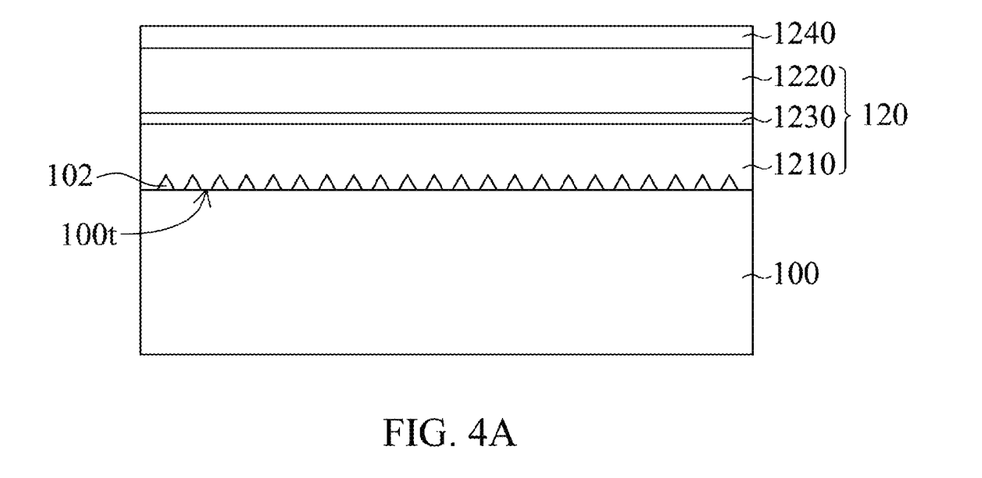
FIGS. 4A-4F show a process flow of a manufacturing method of the light-emitting device in accordance with an embodiment of the present disclosure.
Figure 4B:
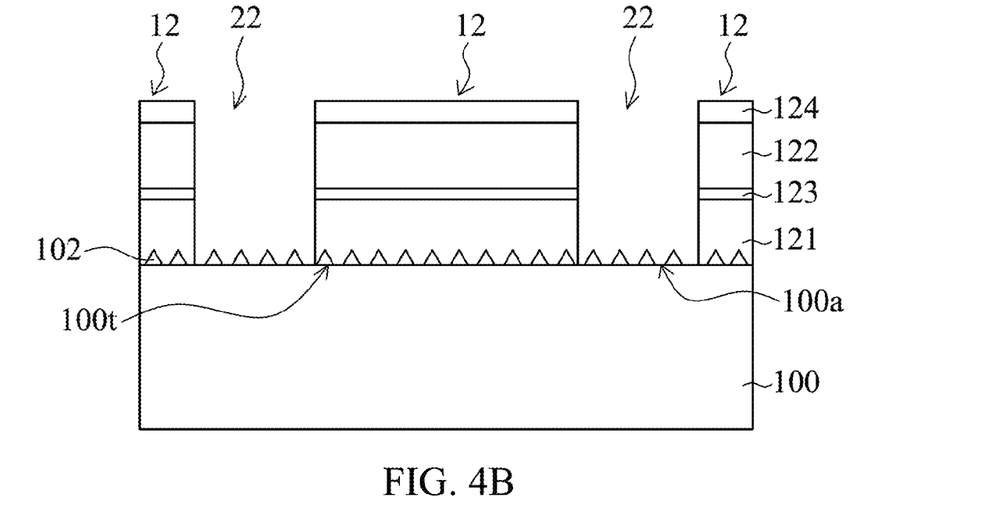
Figure 4C:
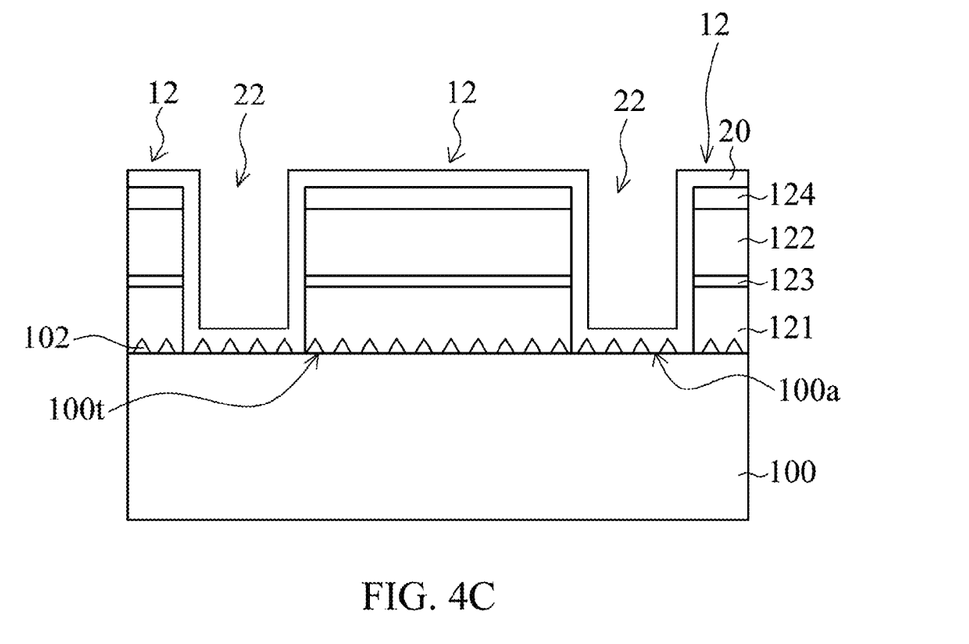
Figure 4D:
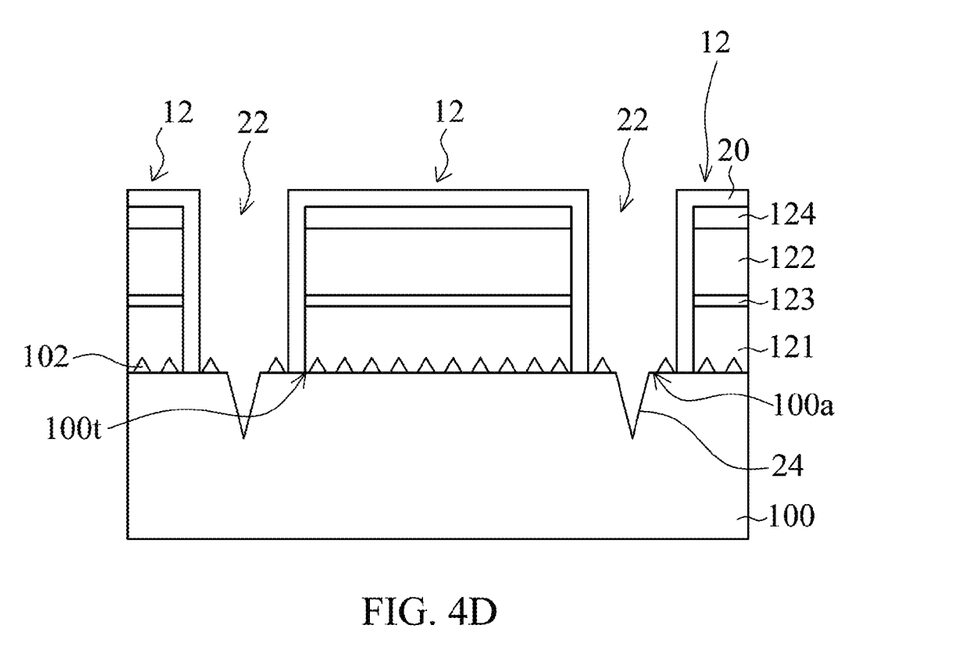
Figure 4E:
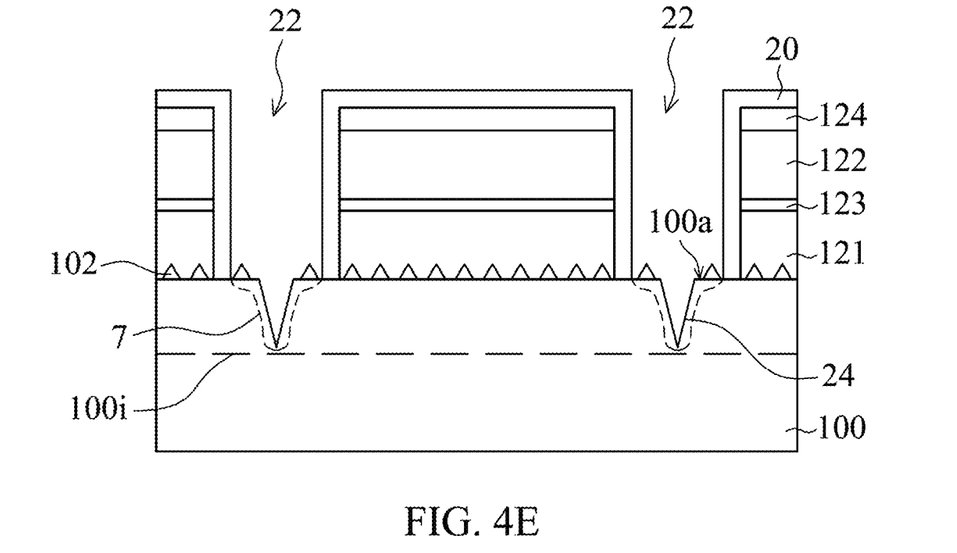
Figure 4F:
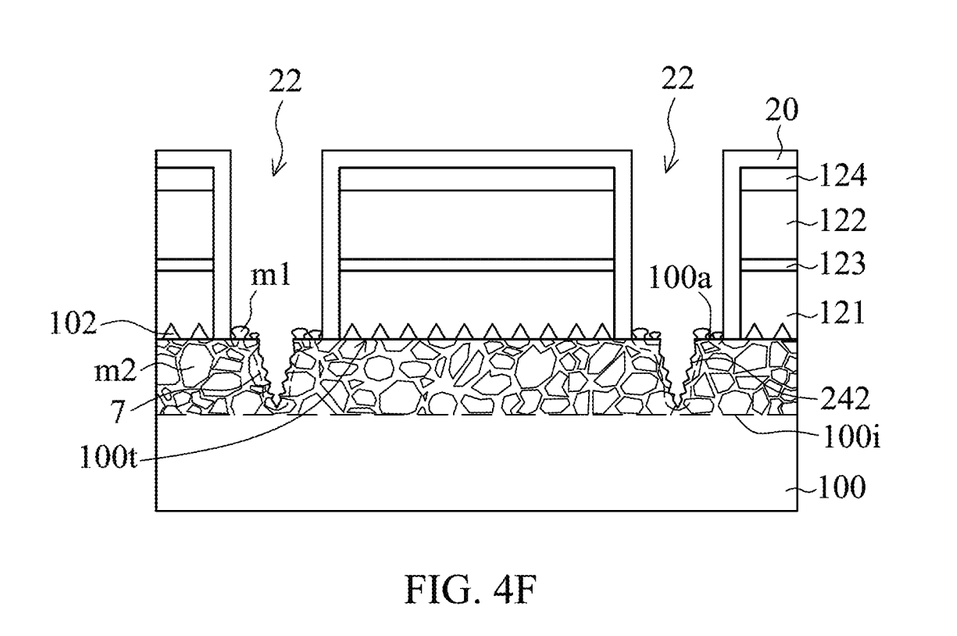
Figure 6:
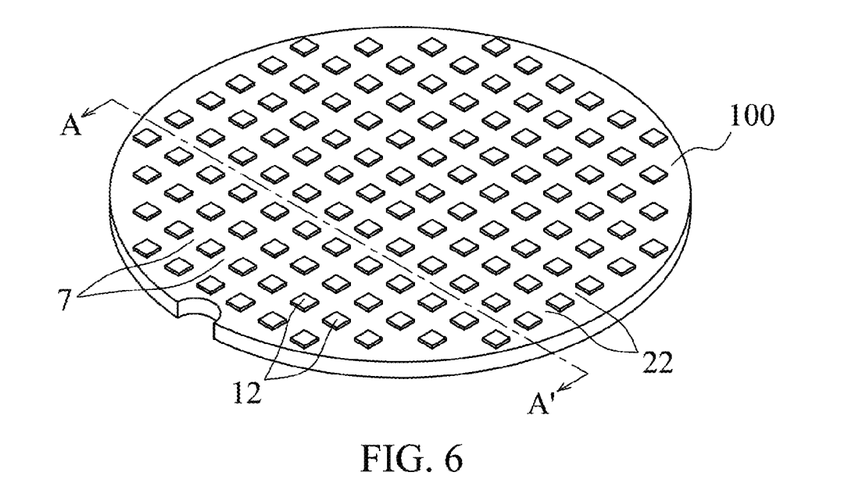
FIG. 6 shows a top view of FIG. 4E or FIG. 4F.

FIGS. 4A-4F show a manufacturing method of the light-emitting device 1 in accordance with an embodiment of the present disclosure. FIG. 6 shows a top view of FIG. 4E or FIG. 4F, and FIG. 4E or FIG. 4F shows cross-section views from line A-A' of FIG. 6. First, as shown in FIG. 4A, a semiconductor stack 120 is epitaxially grown on a growth wafer 100. The semiconductor stack 120 comprises a first semiconductor layer 1210 having a first conductivity type, a second semiconductor layer 1220 having a second conductivity type different from the first conductivity type, and an active layer 1230 formed between the first semiconductor layer 1210 and the second semiconductor layer 1220. The growth wafer 100 comprises a top surface 100t comprising a plurality of concavo-convex structures 102 which improves light extraction efficiency of the light-emitting device 1, wherein the plurality of concavo-convex structures 102 is regularly pattern distributed between the growth wafer 100 and the semiconductor stack 120, and the plurality of concavo-convex structures 102 is formed by patterning and etching the growth wafer 100 such that the growth wafer 100 and the plurality of concavo-convex structures 102 are of one-piece and substantially composed of the same material. The plurality of concavo-convex structures 102 is periodically arranged with a uniform shape. For example, each of the plurality of concavo-convex structures 102 comprises a cone shape. A transparent conductive layer 1240, for example, a layer comprising indium tin oxide (ITO) is formed on the semiconductor stack 120. More specifically, the transparent conductive layer 1240 is formed on the second semiconductor layer 1220.

Next, as shown in FIG. 4B, the semiconductor stack 120 is patterned to form a plurality of light-emitting stacks 12 separated by a plurality of trenches 22, wherein each of the plurality of light-emitting stacks 12 comprises a first semi-conductor layer 121 having a first conductivity type, a second semiconductor layer 122 having a second conductivity type different from the first conductivity type, and an active layer 123 formed between the first semiconductor layer 121 and the second semiconductor layer 122.

Next, as shown in FIG. 4C, a protective layer 20 is conformably formed on the plurality of the light-emitting stacks 12 and an exposed portion 100a of the growth wafer 100, wherein the exposed portion 100a of the growth wafer 100 is defined by the trench 22. In an example of FIG. 4C, the protective layer 20 can be a silicon oxide layer having a thickness of approximately 500-5000 angstroms. The protective layer 20 can be formed by chemical vapor deposition, or spin-coating.

Next, as shown in FIG. 4D, an upper part of the growth wafer 100 is divided or removed by laser dicing or blade cutting along the plurality of trenches 22. In another words, laser dicing or blade cutting is processed in the exposed portion 100a of the growth wafer 100. Thus, a V-shape scribing region is formed on an upper part of the growth wafer 100 from a cross sectional view of the growth wafer 100, and formed inside the exposed portion 100a of the growth wafer 100 from a top view of the growth wafer 100, wherein the V-shape scribing region is free of the protective layer 20.

Next, as shown in FIG. 4E and FIG. 6, ions such as argon cation, hydrogen cation, or nitrogen cation can be implanted into a depth of the growth wafer 100 not covered by the protective layer 20 through an ion implanter. The depth is not smaller than 10% of a thickness of the growth wafer 100 or not smaller than 8 microns. Preferably, the distance between the top surface 100t and the interior 100i is larger than 10 nm when the thickness of the growth wafer 100 is larger than 80 nm. FIG. 4E shows a cross-section view from line A-A' of FIG. 6. The exposed portion 100a of the growth wafer 100 and an exposed surface of the V-shape scribing region are doped by the ions, thus a doped region 7 is formed in FIG. 4E. In another example of the embodiment, the step of FIG. 4E can be processed prior to the step of FIG. 4D.

Figure 5:
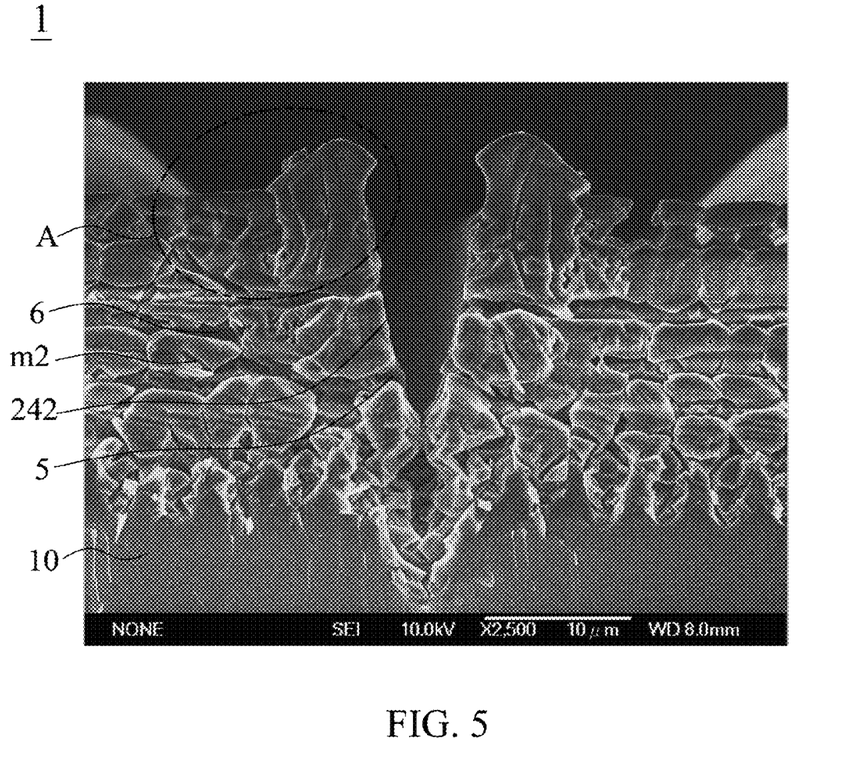
FIG. 5 shows a SEM diagram of a portion of FIG. 4F.

Next, as shown in FIG. 4F and FIG. 6, the doped region 7 is etched by an etchant such as HF. The etchant flows from the exposed portion 100a of the growth wafer 100 and an exposed surface 242 of the V-shape scribing region of the doped region 7, and into an interior of the growth wafer 100, thus the exposed surface 242 of the V-shape scribing region is roughened by the etching step, and the plurality of concavo-convex structures (not shown) of the exposed portion 100a of the growth wafer 100 is roughened to form the plurality of first micro-structures m1 of FIG. 2, and an upper part of the growth wafer 100 is roughened to form the plurality of second micro-structures m2 distributed from the top surface 100t to an interior 100i of the growth wafer 100. FIG. 5 shows a SEM diagram of FIG. 4F. The etchant flows from a plurality of recesses 5 formed on an exposed surface 242 of the V-shape scribing region, and into the exterior 100i of the growth wafer 100 along a plurality of micro-space 6 to form the plurality of second micro-structures m2.

As shown in FIG. 4F, a distance between the top surface 100t and the interior 100i is not smaller than 10% of a thickness of the growth wafer 100 or not smaller than 8 microns. Specifically, the V-shape scribing region comprises a depth larger than 10 nm, and the thickness of the growth wafer 100 is larger than 80 nm. The plurality of regular concavo-convex structures 102 formed on the exposed portion 100a of the growth wafer 100 is etched by the etchant to form the plurality of first micro-structures m1 of FIG. 2, and the detailed description is described above with reference to FIGS. 1-3.

Moreover, a lower part of the growth wafer 100 is divided or removed by laser dicing or physical breaking. In an example of the embodiment, the upper part of the growth wafer 100 is divided by laser dicing, and the lower part of the growth wafer 100 is divided by physically breaking. In another example of the embodiment, the upper part of the growth wafer 100 is divided by physically breaking, and the lower part of the growth wafer 100 is divided by laser dicing. In another example of the embodiment, both the upper part and the lower part of the growth wafer is both divided by laser dicing or physically breaking. The dividing position of the lower part of the growth wafer 100 is divided by laser dicing or physical breaking through a position corresponding to the V-shape scribing region, thus the growth wafer 100 and the light-emitting stacks thereon are separated into a plurality of chips. Each of the plurality of chips comprises the substrate 10 and the light-emitting stack 12 formed on the substrate 10 as previously described in the foregoing embodiments and FIG. 1-3.

According to an embodiment of the present disclosure, total internal reflection of the light emitted from the active layer of the light-emitting device is reduced by forming the plurality of first micro-structures and the plurality of second micro-structures, thus light extraction efficiency is improved. In addition, the light extraction efficiency can be further improved by the inclined surface of the substrate of the light-emitting device, because the total internal reflection is also reduced by the inclined surface.

It will be apparent to those having ordinary skill in the art that various modifications and variations can be made in accordance with the present disclosure without departing from the scope or spirit of the disclosure. In view of the foregoing, it is intended that the present disclosure cover modifications and variations of this disclosure provided they fall within the scope of the following claims and their equivalents.

What is claimed is:
1. A light-emitting device, comprising:
a substrate comprising a top surface, a bottom surface, an inclined surface, and a side surface formed between the top surface and the bottom surface, wherein the inclined surface connects the top surface and the side surface, and the side surface connects the inclined surface and the bottom surface, wherein the inclined surface comprises a plurality of recesses;
a light-emitting stack formed on a portion of the top surface of the substrate, wherein the light-emitting stack comprises a first conductivity-type semiconductor layer, a second conductivity-type semiconductor layer, and an active layer formed between the first conductivity-type semiconductor layer and the second conductivity-type semiconductor layer; and
a plurality of first micro-structures protruded from the top surface of the substrate, wherein the inclined surface comprises a plurality of second micro-structures, the plurality of recesses of the inclined surface is connected with a micro-space formed between the plurality of second micro-structures.
2. The light-emitting device of claim 1, further comprising a plurality of s ores formed in an area of the substrate wherein the area is under another portion of the to surface where the light-emitting stack is not formed thereon,
wherein the plurality of pores is confined by a crystal plane of the substrate.
3. The light-emitting device of claim 2, wherein a feature size of one of the plurality of pores ranges from 0.02 μm to 0.2 μm.

4. The light-emitting device of claim 1, wherein the plurality of first micro-structures and the plurality of second micro-structures comprise same material.

5. The light-emitting device of claim 1, wherein the plurality of second micro-structures comprises irregular shape.

6. The light-emitting device of claim 1, wherein the top surface of the substrate comprises a first portion and a second portion surrounding the first portion from a top view of the light-emitting device, the first portion of the top surface of the substrate comprises a plurality of concavo-convex structures regularly distributed, the plurality of first micro-structures is distributed on the second portion of the top surface of the substrate, and the plurality of first micro-structures comprises dissimilar sizes or shapes, one of the plurality of first micro-structures distant from the light-emitting stack has a height greater than that of another one of the plurality of first micro-structures closer to the light-emitting stack.

7. The light-emitting device of claim 6, wherein a shape of the plurality of concavo-convex structures within the first portion comprises a cone.

8. The light-emitting device of claim 1, wherein an angle between the top surface and the inclined surface or an angle between the inclined surface and the side surface is between 90 degrees and 130 degrees.

9. The light-emitting device of claim 1, wherein the substrate comprises an upper part and a lower part, and an interface formed between the upper part and the lower part, the upper part is surrounded by the inclined surface, the lower part is surrounded by the side surface, and a distance between the top surface of the substrate and the interface is not smaller than 10% of a thickness of the substrate or is larger than 10 μm.

10. The light-emitting device of claim 1, wherein the light-emitting stack comprises an inverted pyramidal shape.

11. The light-emitting device of claim 1, wherein the plurality of second micro-structures comprises a feature size larger than that of the plurality of first micro-structures.

12. The light-emitting device of claim 1, wherein an angle between the inclined surface and the side surface is between 90 degrees and 130 degrees.

13. The light-emitting device of claim 2, further comprising a doped region formed in the area of the substrate where the plurality of pores is formed thereon.

14. The light-emitting device of claim 13, wherein the doped region comprises a dopant other than a dopant in the light-emitting stack.

* * * * *